United States Patent [19]

Urai

[11] Patent Number: 5,347,486
[45] Date of Patent: Sep. 13, 1994

[54] NONVOLATILE MEMORY DEVICE HAVING SELF-REFRESH FUNCTION

[75] Inventor: Takahiko Urai, Tokyo, Japan

[73] Assignee: NEC Corporation, Tokyo, Japan

[21] Appl. No.: 151,196

[22] Filed: Nov. 12, 1993

[30] Foreign Application Priority Data

Nov. 12, 1992 [JP] Japan .................................. 4-302089

[51] Int. Cl.[5] ........................................... G11C 11/40
[52] U.S. Cl. ................... 365/185; 365/189.05; 365/202; 365/203; 365/208; 365/230.06; 365/222
[58] Field of Search ........... 365/185, 202, 203, 189.05, 365/208, 230.06, 222

[56] References Cited

U.S. PATENT DOCUMENTS

| | | | |
|---|---|---|---|
| 4,926,387 | 5/1990 | Madland | 365/203 |
| 4,939,691 | 7/1990 | Mizukami et al. | 365/189.05 |
| 5,056,063 | 10/1991 | Santin et al. | 365/185 |
| 5,241,506 | 8/1993 | Motegi et al. | 365/203 |
| 5,258,959 | 11/1993 | Dallabora et al. | 365/185 |
| 5,295,099 | 3/1994 | Kagami | 365/208 |

OTHER PUBLICATIONS

Hitoshi Kume et al. "A 3.42 $\mu m^2$ Flash Memory Cell Technology Conformable to a Sector Erase", Symp. VLSI Tech., 1991, pp. 77-78.

Primary Examiner—Joseph E. Clawson, Jr.
Attorney, Agent, or Firm—Sughrue, Mion, Zinn, Macpeak & Seas

[57] ABSTRACT

In an nonvolatile memory device, a transition circuit is provided between an output of a sense amplifier and an input of a write amplifier. In a write/read mode, data is transited from an input/output buffer via the transition circuit to an input of the write amplifier or from an output of the sense amplifier via the transition circuit to an input/output buffer. In a self-refresh mode, data from the output of the sense amplifier is fed back via the transition circuit to the input of the write amplifier.

7 Claims, 8 Drawing Sheets

⋮

—|[P— P-CHANNEL ENHANCEMENT TYPE TRANSISTOR

—|[N— N-CHANNEL ENHANCEMENT TYPE TRANSISTOR

N-CHANNEL DEPLETION TYPE TRANSISTOR

FLOATING TYPE CELL TRANSISTOR

N-CHANNEL ENHANCEMENT TYPE TRANSISTOR

N-CHANNEL DEPLETION TYPE TRANSISTOR

NONVOLATILE MEMORY DEVICE HAVING SELF-REFRESH FUNCTION

BACKGROUND OF THE INVENTION

1. Field of the Invention

The present invention relates to a nonvolatile memory device, and more particularly, to a flash electrically erasable programmable read-only memory (EEPROM).

2. Description of the Related Art

In a nonvolatile memory device, an electrical write operation can be carried out after the device is mounted on a printed board. One typical example of such a device is a flash memory which bas an advantage in that data storage is possible without a backup battery and which is highly integrated. However, the flash memory is disadvantageous in terms of time of taken for erasing/writing operations, necessity of two power supplies such as 5 V and 12 V, and impossibility of reducing the voltages of the power supplies.

Generally, a flash memory is completely erased in one operation. However, in order to be compatible with a hard disk device (HDD) or a floppy disk device (FDD), there have been suggested two kinds of sector erasable technology: a method of applying a positive voltage to sources; and a method of applying a negative voltage to control gates.

For example, a NOR type flash EEPROM is formed by a plurality of word lines, a plurality of bit lines, and a plurality of nonvolatile memory cells each connected to one of the word lines and one of the bit lines. In this case, one of the nonvolatile memory cells has a source, a drain connected to one of the bit lines, a floating gate, and a control gate connected to one of the word lines.

According to the method of applying a positive voltage, a plurality of sources of the memory cells are divided into a plurality of sectors. For example, in order to suppress an increase in chip area of the flash EEPROM, each sector is made long along the bit lines, In this case, all the memory cells connected to the same bit line are simultaneously erased by applying a positive voltage to the sources thereof utilizing Fowler-Nordheim tunneling, and thereafter, a writing operation is performed upon each of the memory cells. Therefore, each of the memory cells receives a drain disturbance by the write operation upon the other memory cells; however, the maximum number of drain disturbances is $n-1$, where n is the number of memory cells connected to one bit line, since drain disturbances before each writing operation upon the memory cells are never accumulated. Also, when erasing/writing operations are performed upon one selector, no stress is imposed on the memory cells of the other sectors, i.e., no drain disturbance is caused in the memory cells of the other sectors However, if the number of sectors is increased by adopting the above-mentioned positive voltage-applying method, the chip area of the flash EEPROM is remarkably increased due to the increased number of con, non source regions of the memory cells.

On the one hand, according to the negative voltage-applying method, a negative voltage is applied to one word line, i.e,, the control gates of the memory cells connected thereto. In this case, a positive voltage is applied to all the sources or the substrate. Thus, electrons of the floating gates of the memory cells connected to the same word line are expelled to the source or the substrate due to Fowler-Nordheim tunneling, to thereby erase the memory cells (see: Hitoshi Kume et al., "A 3.42 $\mu m^2$ Flash Memory Cell Technology Conformable to a Sector Erase", Symp. VLSI Tech, 1991, pp. 77–78). That is, one sector is formed by the memory cells connected to one word line (or two or more word lines). In this case, it is unnecessary to divide the source regions of the memory cells into a plurality of sectors, and accordingly, the chip area of the flash EEPROM is not increased. However, when erasing/writing operations are performed upon one selector (one word line), a drain disturbance is always caused in the memory cells of the other sectors (the other word lines). In addition, since an erasing operation is never performed upon a memory cell unless a sector including this memory cell is selected, drain disturbances may be accumulated within the memory cells of the non-selected sectors. That is, according to the negative voltage-applying method, since the tolerance to accumulated drain disturbances is so small as compared with the positive voltage-applying method, the device must be designed for enduring this tolerance.

Note that, it has been suggested that the concentration of impurities in the drains of memory cells be reduced, to thereby enhance the tolerance to accumulated drain disturbances (also see the above-mentioned document). In this case, however, if the concentration of impurities in the drains is fluctuated, the tolerance of drain disturbances may be remarkably deteriorated. Also, if the concentration of impurities in sources is the same as that of impurities in drains, the erasing speed for electrons to expel to the sources is reduced. Otherwise, i.e., if the concentration of impurities in the sources is different from that of impurities in the drains, the manufacturing steps are increased, thus increasing the manufacturing cost.

SUMMARY OF THE INVENTION

It is, therefore, an object of the present invention to enhance the tolerance to accumulated drain disturbances in a nonvolatile semiconductor memory device such as a flash EEPROM using the negative voltage applying method for an erasing operation.

According to the present invention, in a nonvolatile memory device, a transition circuit is provided between an output of a sense amplifier and an input of a write amplifier. In a write/read mode, data is transited from an input/output buffer via the transition circuit to an input of the write amplifier or from an output of the sense amplifier via the transition circuit to an input/output buffer. In a self-refresh mode, data from the output of the sense amplifier is fed back via the transition circuit to the input of the write amplifier.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Figure 1:
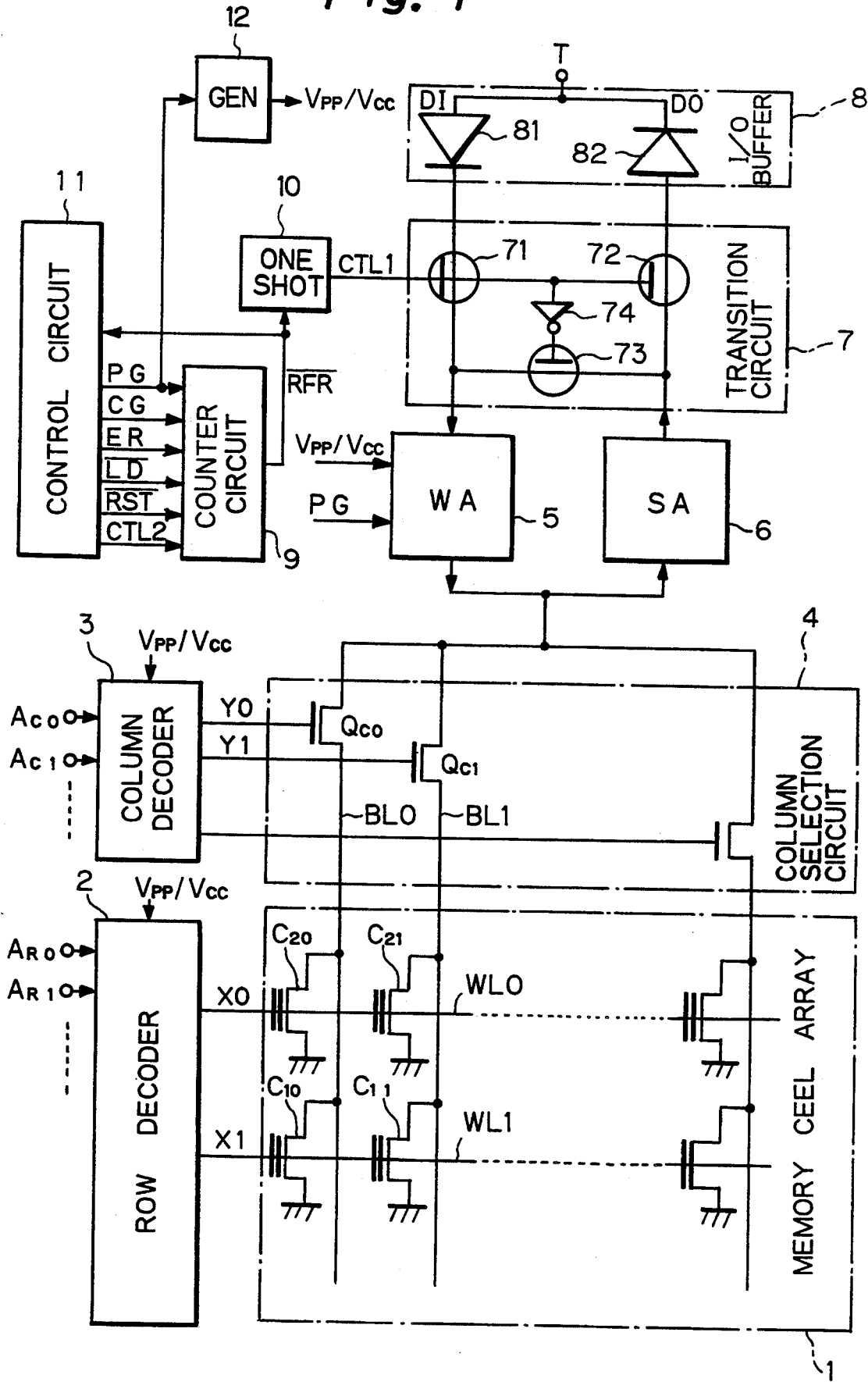
FIG. 1 is a circuit diagram illustrating an embodiment of the nonvolatile memory device according to the present invention.

In FIG. 1, which illustrates an embodiment of the present invention, a plurality of word lines WL0, WL1, . . . and a plurality of bit lines BL0, BL1, . . . are provided. Reference numeral 1 designates a memory cell array formed by memory cells $C_{00}$, $C_{01}$, . . . , $C_{10}$, $C_{11}$ . . . each of which has a source connected to the ground, a drain connected to one of the bit lines BL0, BL1, . . . , a floating gate, and a control gate connected to one of the word lines WL0, WL1, . . . .

A row decoder 2 receives row address signals $A_{R0}$, $A_{R1}$, . . . to select one of the word lines WL0, WL1, . . . , so that the voltage such as X0 at the selected word line WL0 is made high ($=V_{PP}/V_{CC}$). Also, a column decoder 3 receives column address signals $A_{C0}$, $A_{C1}$, . . . to select one of the bit lines BL0, BL1, . . . . In this case, the voltage such as Y0 is made high ($=V_{PP}/V_{CC}$), so as to turn ON one of transistors $Q_{C0}$, $Q_{C1}$, . . . of a column selection circuit 4.

Reference numeral 5 designates a write amplifier and 6 designates a sense amplifier. The write amplifier 5 and the sense amplifier 6 are connected via a transition circuit 7 to an input portion 81 and an output portion 82 of an input/output (I/O) buffer 8, which is connected commonly to an input/output (I/O) terminal T.

The transition circuit 7 includes a transfer gate 71 connected between the input portion 81 of the I/O buffer 8 and an input of the write amplifier 5, a transfer gate 72 connected between an output of the sense amplifier 6 and the output portion 82 of the I/O buffer 8, a transfer gate 73 connected between the input of the write amplifier 5 and the output of the sense amplifier 6, and an inverter 74.

During a write mode, the transfer gates 71 and 72 are turned ON, and the transfer gate 73 is turned OFF. Therefore, input data DI as write data is supplied from the terminal T via the input portion 81 of the I/O buffer 8 to the transition circuit 7 which transits the write data DI to the write amplifier 5. As a result, the write data DI is written into a selected memory cell such as $C_{00}$.

Also, during a read mode, the transfer gates 71 and 72 are also turned ON, and the transfer gate 73 is also turned OFF. Therefore, read data is supplied from a selected memory cell such as $C_{00}$ via the sense amplifier 6 to the transition circuit 7 which transits the read data as output data DO to the output portion 82 of the I/O buffer 8.

Further, during a self-refresh mode, the transfer gates 71 and 72 are turned OFF and the transfer gate 73 is turned ON. Therefore, read data supplied from a selected memory cell such as $C_{00}$ to the sense amplifier 6 is fed back via the transfer gate 73 of the transition circuit 7 to the write amplifier 5. As a result, the read data DI is again written into the selected memory cell such as $C_{00}$.

The transition circuit 7 is controlled by a counter circuit 9 and a monostable multivibrator (one-shot) 10. That is, the counter circuit 9 counts a number of writing operations or erasing operations, and determines whether or not the counted number has reached a predetermined number. When the counted number reaches the predetermined number, the counter circuit 9 generates a refresh signal $\overline{RFR}$ and transmits it to the one-shot 10. As a result, the one-shot 10 generates a high level control signal CTL1 having a definite time period and transmits it to the transition circuit 7. Thus, in this case, the device of FIG. 1 is in a refresh mode for the above-mentioned definite time period. Note that the one-shot 10 is triggered when the refresh signal $\overline{RFR}$ is changed from a low level to a high level.

The counter circuit 9 is controlled by a control circuit 11 which controls the entire device of FIG. 1.

Reference numeral 12 designates a $V_{PP}/V_{CC}$ voltage generating circuit for generating a voltage $V_{PP}/V_{CC}$ which are applied to the row decoder 2, the column decoder 3, the write amplifier 5, and the like.

Next, each block of the device of FIG. 1 will be explained in more detail.

Figure 2:
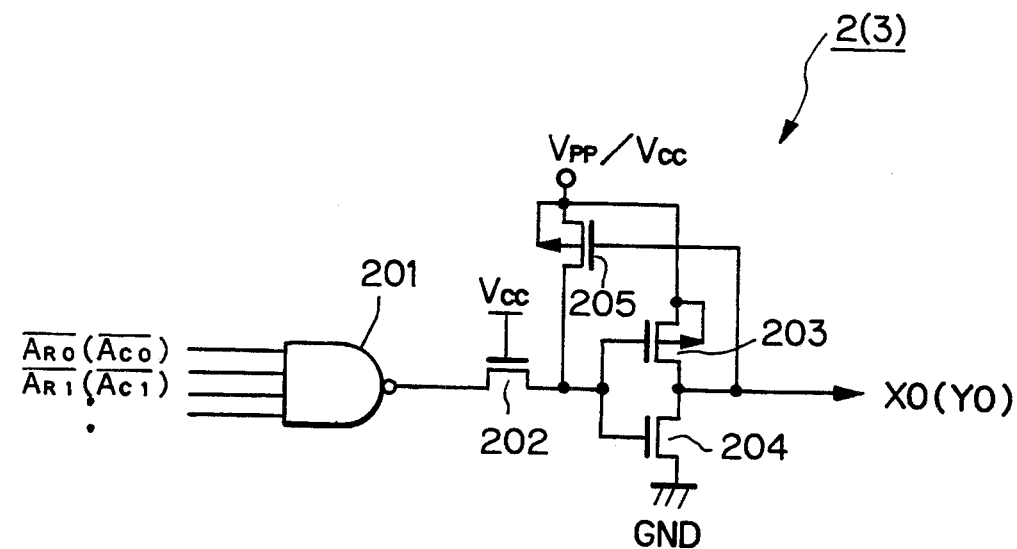
FIG. 2 is a circuit diagram of the row decoder (column decoder) of FIG. 1.
Figure 2:
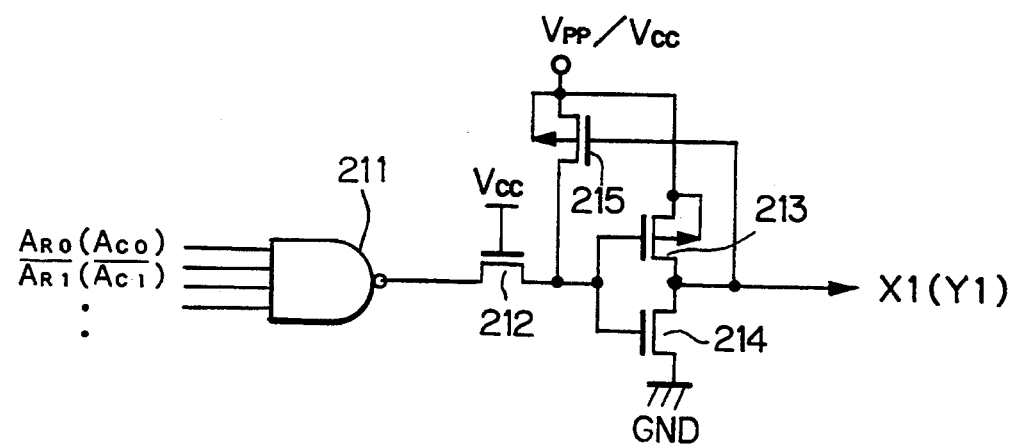

FIG. 2 is a detailed circuit diagram of the row decoder 2 (or the column decoder 3) of FIG. 1. Note that the row decoder 2 is similar to the column decoder 3. For the voltage X0 (Y0) on the word line WL0 (the bit line BL0), a NAND circuit 201 for receiving address signals $A_{R0}$, $A_{R1}$, . . . ($A_{C0}$, $A_{C1}$, . . . ), an N-channel MOS transistor 202 for preventing a high voltage $V_{PP}$ from being applied to the output of the NAND circuit 201, an inverter formed by a P-channel MOS transistor 203 and an N-channel MOS transistor 204, and a P-channel transistor 205 for feeding back the output of the inverter to the input thereof, are provided. For example, when the address signals $A_{R0}$, $A_{R1}$, . . . ($A_{C0}$, $A_{C1}$, . . . ) are low (logic 0), the output of the NAND circuit 201 is made low, so that the voltage X0 (Y0) is made high ($=V_{PP}/V_{CC}$), thus selecting the word line WL0 (the bit line BL0). In this case, in a write mode, the voltage X0 (Y0) is $V_{PP}$ (such as 12 V), while in a read mode, the voltage X0 (Y0) is $V_{CC}$ (such as 5 V).

Figure 3:
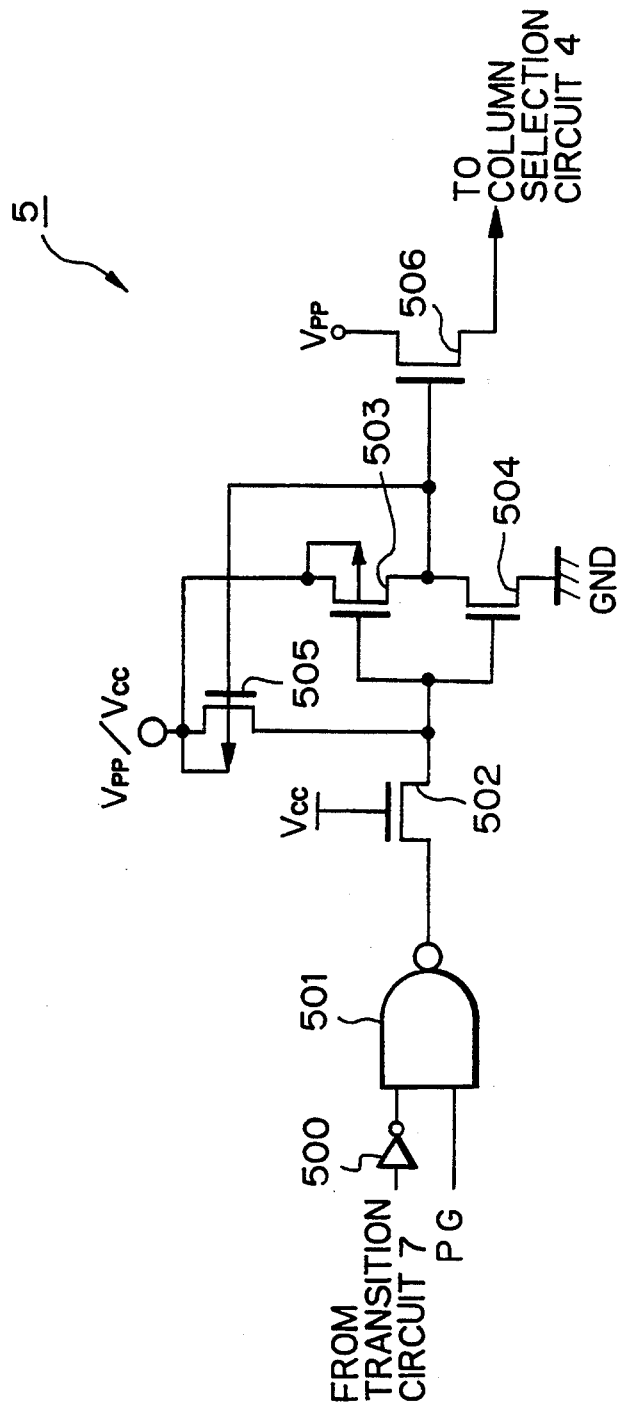
FIG. 3 is a circuit diagram of the write amplifier of FIG. 1.

In FIG. 3, which is a detailed circuit diagram of the write amplifier 5 of FIG. 1, the write amplifier 5 includes a NAND circuit 501 for receiving write data DI from the transition circuit 7 via an inverter 500 and a program signal PG from the control circuit 11. In a read mode where the program signal PG is low (=GND), the NAND circuit 501 is deactivated, thus prohibiting the transition of the data from the transition circuit 7 therethrough. Conversely, in a write mode where the program signal PG is high (=$V_{CC}$), the NAND circuit 501 passes the data from the transition circuit 7, so that the output of the write amplifier 5 is high or low in accordance with the write data.

Figure 4:
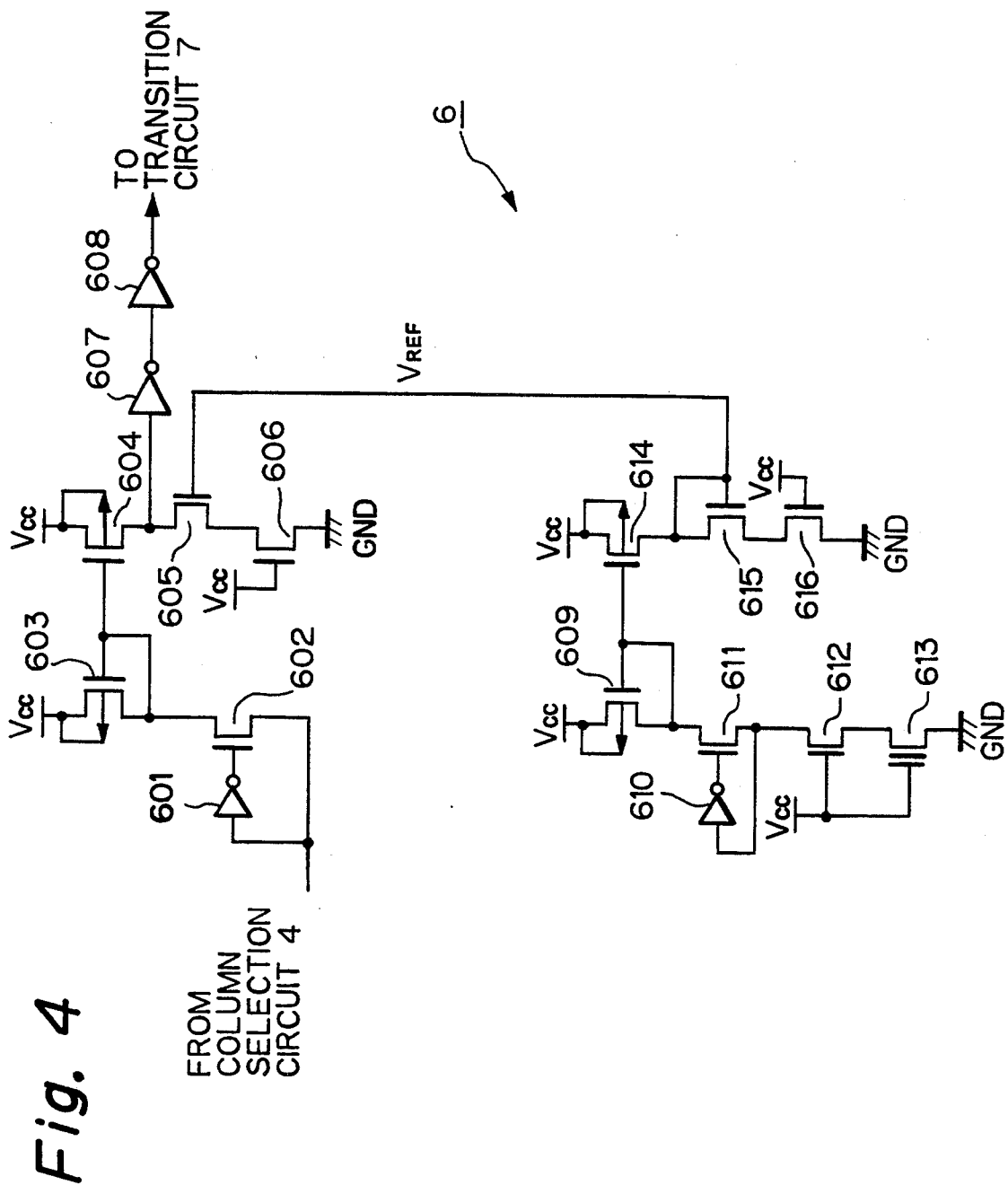
FIG. 4 is a circuit diagram of the sense amplifier of FIG. 1.

In FIG. 4, which is a detailed circuit diagram of the sense amplifier 6, this sense amplifier includes an inverter 601 and an N-channel MOS transistor 602 for receiving the voltage of a selected memory cell such as $C_{00}$ via the column selection circuit 4. P-channel MOS transistors 603 and 604 and N-channel MOS transistors 605 and 606 as well as the transistor 602 form a differential amplifier. The output of this differential amplifier is supplied via inverters 607 and 608 to the transtion circuit 7.

In FIG. 4, applied to a gate of the transistor 605 is a reference voltage $V_{REF}$ generated by a circuit formed by a P-channel MOS transistor 609, an inverter 610, an N-channel MOS transistor 612, a floating type cell transistor 613, a P-channel MOS transistor 614, and N-channel MOS transistors 615 and 616. In this case, the floating type cell transistor 613 is in a normal ON state where the voltage $V_{CC}$ is applied to the gate thereof, and therefore, an N-channel enhancement type or depletion type MOS transistor can be used instead of the floating type cell transistor 613.

Figure 5:
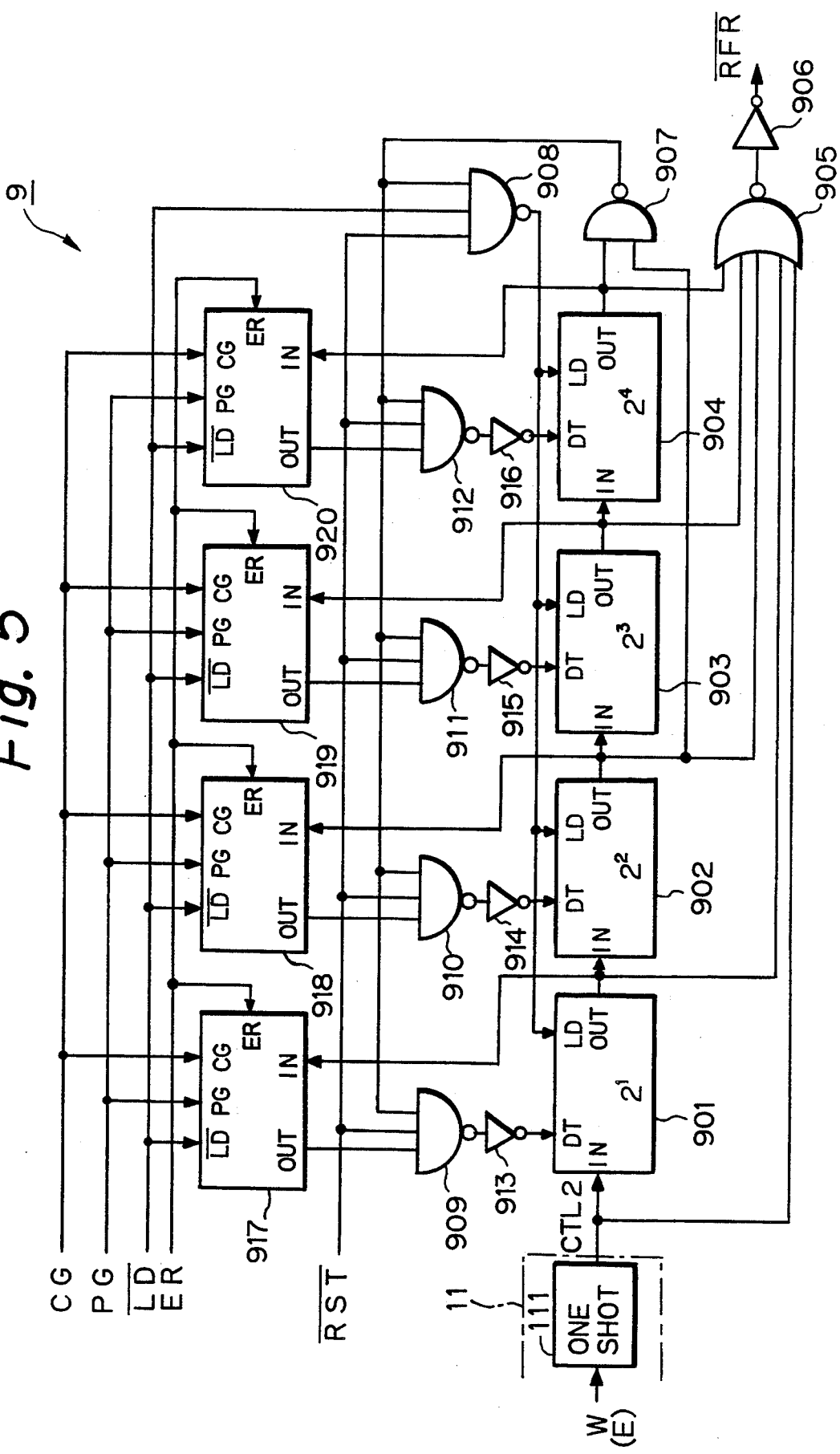
FIG. 5 is a circuit diagram of the counter circuit of FIG. 2.

In FIG. 5, which is a detailed circuit diagram of the counter circuit 9 of FIG. 1, four binary counters 901, 902, 903 are provided for counting a number of writing operations. In this case, a control signal CTL2 is supplied to the counter 901 from a one-shot 111 provided in the control circuit 11. This one-shot 111 generates a high level having a predetermined duration when a write signal W is changed from a low level to a high level. Note that the counters 901 through 904 entirely serve as a 32-ary counter.

A NOR circuit 905 and an inverter 906 detects that all of the counters 901 through 904 show zero, i.e., that the counters 901 through 904 are reset. That is, every time the counters 901 through 904 are reset, an inverted signal of a refersh signal RER is made active (low).

The counters 901 through 904 are reset by NAND circuits 907 through 912 and inverters 913 through 916. Since the NAND circuit 907 receives the outputs of the counters 902 and 904, the NAND circuit 907 detects that all of the counters 901 through 904 show 20 ($=2^2+2^4$). Therefore, every time all of the counters 901 through 904 show 20, the output of the NAND circuit 907 is made low, so that the NAND circuit 908 generates a high level signal and transmits it to the load terminals LD of the counters 901 through 904, while the data terminals DT of the counters 901 through 904 are made low ($=0$) by the NAND circuits 909 through 912 and the inverters 913 through 916. As a result, the counters 901 through 904 are reset every time 20 writing operations carried out.

Also, the counters 901 through 904 are reset by an inverted signal of a reset signal RST supplied from the control circuit 11. That is, when the inverted signal of the reset signal RST is low due to the power on or the like to reset the entire device, the output of the NAND circuit 908 is made low ($=0$) while the outputs of the inverters 913 through 916 are made low ($=0$). As a result, the counters 901 through 904 are reset every time the reset signal RST is high.

Reference numerals 917 through 920 designate maintaining circuits for maintaining the contents of the counters 901 through 904, respectively. That is, when an inverted signal of a load signal LD from the control circuit 11 is made high, the contents of the counters 901 through 904 are stored in the maintaining circuits 917 through 920, respectively. Conversely, when the inverted signal of the load signal LD is made low, the contents of the maintaining circuits 917 through 920 are transmitted via the NAND circuits 909 through 912 and the inverters 913 through 916 to the data terminals DT of the counters 901 through 904, respectively.

Note that, if the one-shot 111 receives an erase signal E, the counters 901 through 904 can count a number of erasing operations.

Figure 6:
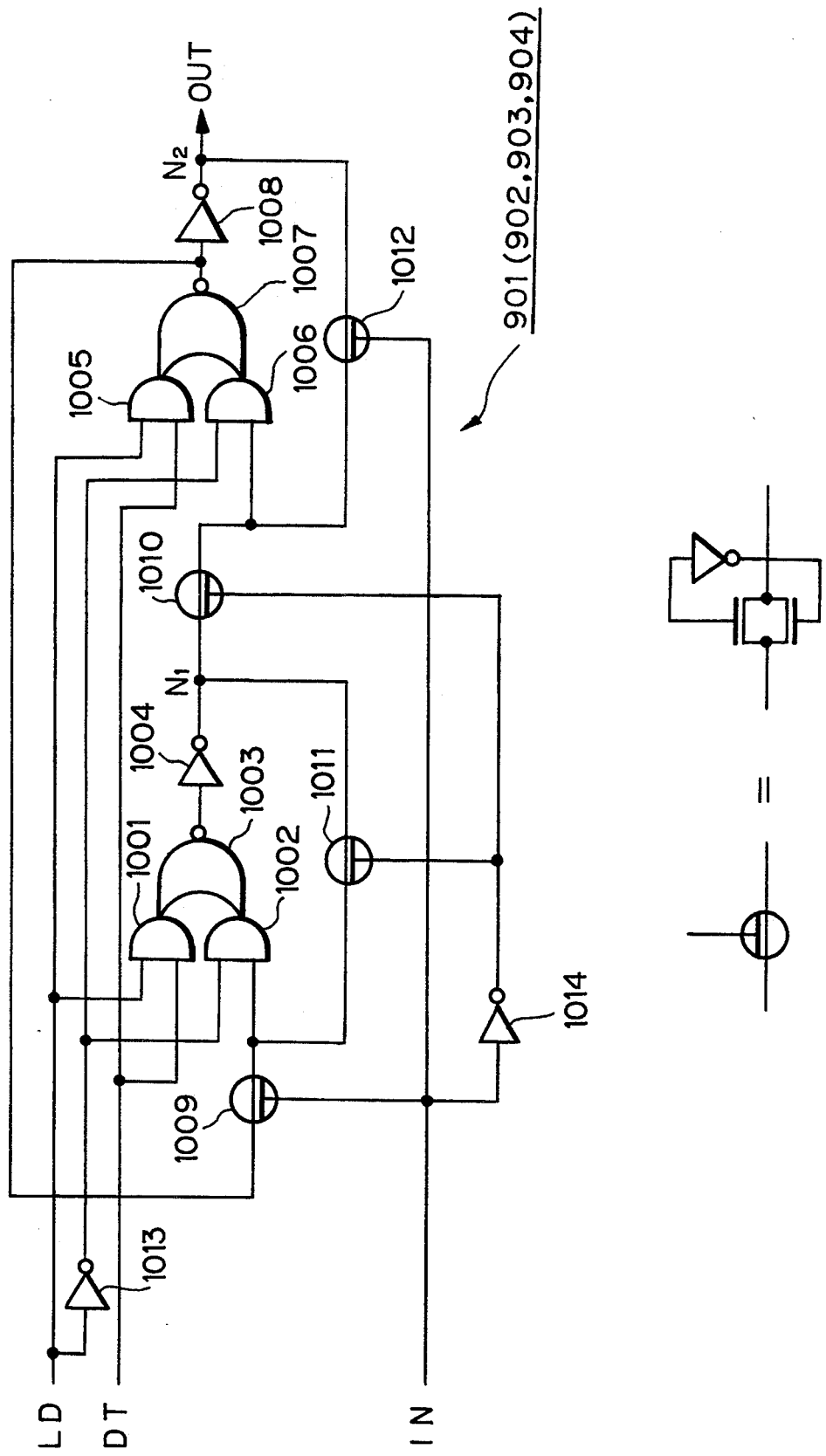
FIG. 6 is a circuit diagram of the counter of FIG. 5.

In FIG. 6, which is a detailed circuit diagram of the counter 901 (902, 903, 904) of FIG. 5, the counter 901 includes a first stage formed by AND circuits 1001 and 1002 connected to inputs of NOR circuits 1003, and an inverter 1004, and also includes a second stage formed by AND circuits 1005 and 1006 connected to inputs of NOR circuits 1007, and an inverter 1008.

Connected between the first and second stages are transfer gates 1009 and 1010. Also, interposed within the first and second stages are transfer gates 1011 and 1012. Further, inverters 1013 and 1014 are provided.

When the voltage at the load terminal LD is high, the AND circuits 1001 and 1005 are enabled while the AND circuits 1002 and 1006 are disabled. As a result, if data at the data terminal DT is high, the nodes $N_1$ and $N_2$ of the first and second stages are both made high. Conversely, if data at the data terminal DT is low, the nodes $N_1$ and $N_2$ are both made low. Thus, when the voltage at the load terminal LD is high, the data of the corresponding maintaining circuit is stored on the nodes $N_1$ and $N_2$, or the nodes $N_1$ and $N_2$ are reset.

When the voltage at the load terminal LD is low, the AND circuits 1001 and 1005 are disabled while the AND circuits 1002 and 1006 are enabled. As a result, the counter 901 counts data at the input terminal IN. That is, when the voltage at the input terminal IN is low, the first stage for the node $N_1$ is in a latched state while the second stage for the node $N_2$ is in a non-latched state. In this state, assuming that the voltages at the nodes $N_1$ and $N_2$ are both low, accordingly, the first stage latches 0 (low).

Next, when the voltage at the input terminal IN becomes high, the first stage for the node $N_1$ enters a non-latched state while the second stage for the node $N_2$ enters a latched state. As a result, the second stage latches 0 (low).

Next, when the voltage at the input terminal IN becomes low, the first stage for the node $N_1$ enters a latched state while the second stage for the node $N_2$ enters a non-latched state. As a result, the first stage latches 1 (high).

Next, when the voltage at the input terminal IN becomes high, the first stage for the node $N_1$ enters a non-latched state while the second stage for the node $N_2$ enters a latched state. As a result, the second stage latches 1 (high).

Thus, the voltages at the nodes $N_1$ and $N_2$ are changed as follows:

| IN | $N_1$ | $N_2$ | |
|---|---|---|---|
| 0 | 0 | 0 | (INITIAL STATE) |
| 1 | 0 | 0 | |
| 0 | 1 | 0 | |
| 1 | 1 | 1 | |
| 0 | 0 | 1 | |
| 1 | 0 | 0 | |
| 0 | 1 | 0 | |
| 1 | 1 | 1 | |
| 0 | 0 | 1 | |

Therefore, the counter 901 (902, 903, 904) servee as a binary counter.

Figure 7:
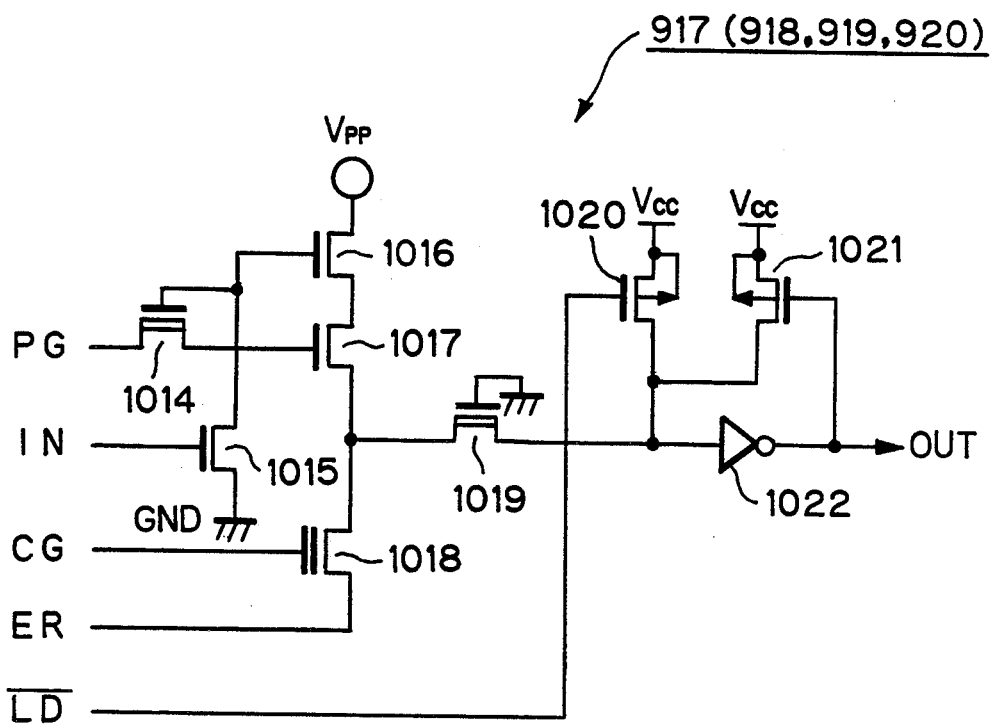
FIG. 7 is a circuit diagram of the maintaining circuit of FIG. 5.
Figure 7:
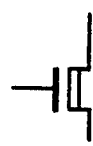
Figure 7:

In FIG. 7, which is a detailed circuit diagram of the maintaining circuit 917 (918, 919, 920) of FIG. 5, the maintaining circuit 917 includes an N-channel deletion type MOS transistor 1014, N-channel enhancement type MOS transistors 1016 and 1017, a floating type cell transistor, an N-channel depletion type MOS transistor 1019, P-channel enhancement type MOS transistors 1020 and 1021, and an inverter 1022.

In order to erase the contents of the maintaining circuits 917 through 920, the control circuit 11 generates various control signals PG, CG, ER and $\overline{LD}$. In this case, $$V_{PP}=GND$$

$CG = GND$ $ER = V_{PP}$ $\overline{LD} = V_{CC}$

Therefore, the transistors 1016 and 1017 are turned OFF, so that no voltage is applied to the drain of the floating type cell transistor 1018. In this state, in the floating type cell transistor 1018, the ground potential (GND) is applied to the gate and the high voltage $V_{PP}$ is applied to the source, so that electrons stored in the floating gate are expelled thereform due to Fowler-Nordheim tunneling, thus performing an erasing operation upon the floating type cell transistor 1018. In this case, note that the transistor 1020 is always turned OFF, and also the voltage at the output terminal OUT is meaningless.

Also, in order to store the contents of the counters 901 through 904 in the maintaining circuits 917 through 920, respectively, the control circuit 11 generates various control signals PG, CG, ER and $\overline{LD}$. In this case, $PG = V_{PP}$ $CG = V_{PP}$ $ER = GND$ $\overline{LD} = V_{CC}$ Therefore, if $IN = GND$ ($=0$), a high voltage is applied via the transistors 1016 and 1017 to the drain of the floating type cell transistor 1018 while the ground potential is applied to the source thereof. As a result, hot electrons are generated in the vicinity of the drain of the floating type cell transistor 1018 and are injected into the floating gate thereof. Thus, data ($=0$) at the terminal IN is written into the floating type cell transistor 1018. Conversely, if $IN = V_{CC}$ ($=1$), the transistor 1016 is turned OFF, and no voltage is applied to the drain of the floating type cell transistor 1018, so that no hot electrons are generated in the vicinity of the drain thereof. Therefore, no change occurs in the floating type cell transistor 1018. In this case, note that the transistor 1020 is always turned OFF, and also the voltage at the output terminal OUT is meaningless.

Further, in order to restore the contents of the maintaining circuits 917 through 920 in the counters 901 through 904, respectively, the control circuit 11 generates various control signals PG, CG, ER and $\overline{LD}$. In this case, $PG = GND$ $CG = V_{CC}$ $ER = GND$ $\overline{LD} = GND$ Therefore, the transistors 1016 and 1017 are turned OFF. In this case, since the voltage $V_{CC}$ is applied to the gate of the floating type cell transistor 1018, the drain thereof depends upon the content of the floating type cell transistor 1018. If this content is 0, the floating type cell transistor 1018 is turned OFF, so that the drain of the floating type cell transistor 1018 is made high since the transistor 1020 is turned ON due to the low level of the control signal $\overline{LD}$. Thus, the voltage at the terminal OUT is made low. Conversely, if this content is 1, the floating type cell transistor 1018 is turned ON, so that the drain of the floating type cell transistor 1018 is made low. Thus, the voltage at the terminal OUT is made high.

Figure 8:
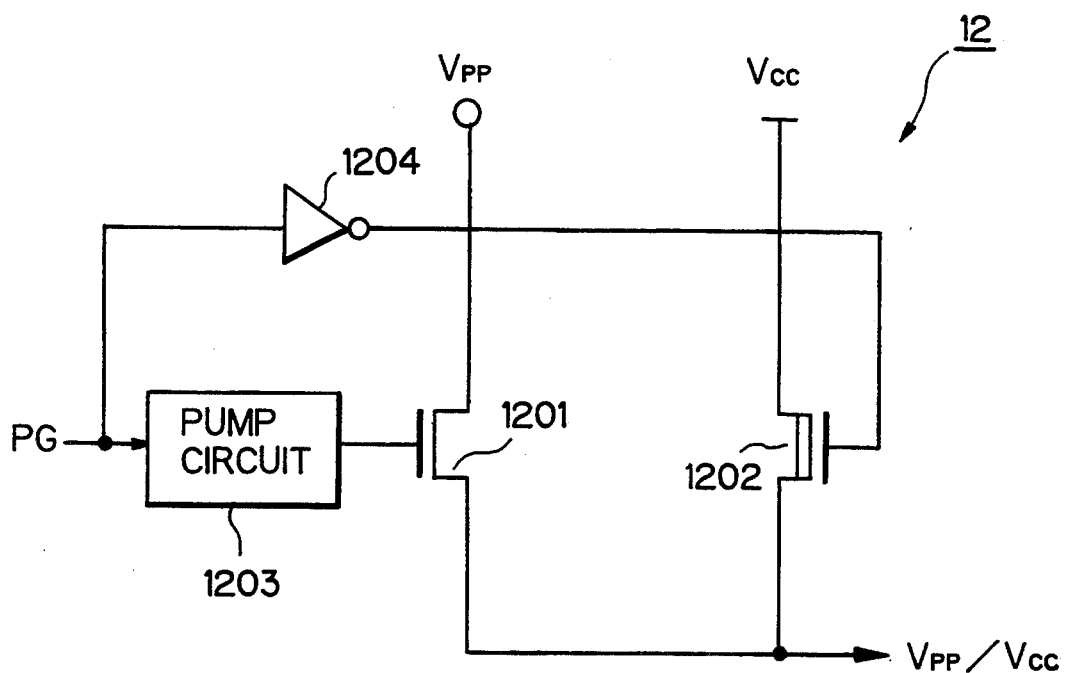
FIG. 8 is a circuit diagram of the $V_{PP}/V_{CC}$ voltage generating circuit of FIG. 1.
Figure 8:
Figure 8:
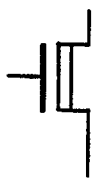

In FIG. 8, which is a detailed circuit diagram of the $V_{PP}/V_{CC}$ voltage generating circuit 12 of FIG. 1, this circuit 12 includes an N-channel enhancement type MOS transistor 1201 connected to a high voltage supply $V_{PP}$ (such as 12 V) and an N-channel depletion type MOS transistor 1202 connected to a voltage supply $V_{CC}$ (such as 5 V). The transistor 1201 is controlled by a pump circuit 1203 which generates a high voltage higher than $V_{PP}$, while the transistor 1202 is controlled by an inverter 1204. The pump circuit 1203 and the inverter 1204 are both controlled by the control signal PG from the control circuit 11. If $PG = V_{PP}$, the pump circuit 1203 is enabled to turn ON the transistor 1201, so that the voltage $V_{PP}/V_{CC}$ equals $V_{PP}$. Contrary to this, if $PG = GND$, the output of the inverter 1202 is made high ($=V_{CC}$) to turn ON the transistor 1202, so that the voltage $V_{PP}/V_{CC}$ equals $V_{CC}$.

As explained hereinbefore, according to the present invention, since a self-refresh function is introduced into the nonvolatile semiconductor memory device, the tolerance to accumulated drain disturbances can be enhanced.

I claim:

1. A nonvolatile memory device comprising:
   a plurality of word lines;
   a plurality of bit lines;
   a plurality of nonvolatile memory cells, each connected to one of said word lines and one of said bit lines;
   a row selecting means, connected to said word lines, for selecting one word line therefrom and driving it;
   a write amplifier;
   a sense amplifier;
   a column selecting means, connected to said bit lines, to an output of said write amplifier, and to an input of said sense amplifier, for selecting one bit line therefrom to connect it to the output of said write amplifier and the input of said sense amplifier;
   an input/output buffer; and
   a transition circuit, connected to said input/output buffer, to said write amplifier, and to said sense amplifier, for transisting data from said input/output buffer to an input write amplifier in a write mode, transiting data from an output of said sense amplifier to said input/output buffer in a read mode, and transiting data from the output of said sense amplifier to the input of said write amplifier in a self-refresh mode.

2. A device as set forth in claim 1, further comprising:
   means for counting a number of writing operations performed upon said nonvolatile memory cells;
   means for determining whether or not the number of writing operations has reached a predetermined value; and
   means for putting said nonvolatile memory cells in a self-refresh mode to control said transition circuit, to thereby transit data from the output of said sense amplifier to the input of said write amplifier.

3. A device as set forth in claim 2, further comprising means for storing the counted number of writing operations, said counting means counting the writing operations based upon the stored number of writing operations.

4. A device as set forth in claim 1, further comprising:

means for counting a number of erasing operations performed upon said nonvolatile memory cells;

means for determining whether or not the number of erasing operations has reached a predetermined value; and means for putting said nonvolatile memory cells in a self-refresh mode to control said transition circuit to thereby transit data from the output of said sense amplifier to the input of said write amplifier.

5. A device as set forth in claim 4, further comprising means for storing the counted number of erasing operations, said counting means counting the erasing operations based upon the stored number of erasing operations.

6. A device as set forth in claim 1, further comprising:

means for resetting said device; and means for putting said nonvolatile memory cells in a self-refresh mode to control said transition circuit, to thereby transit data from the output of said sense amplifier to the input of said write amplifier.

7. A device as set forth in claim 1, wherein said nonvolatile memory cells are flash-type EEPROM memory cells where an erasing/writing operation is performed upon a sector of said memory cells connected to one or more of said word lines.

* * * * *

UNITED STATES PATENT AND TRADEMARK OFFICE
CERTIFICATE OF CORRECTION

PATENT NO. : 5,347,486
DATED : September 13, 1994
INVENTOR(S) : URAI

It is certified that error appears in the above-identified patent and that said Letters Patent is hereby corrected as shown below:

Col. 1, line 9, delete "erasabIe" and insert --erasable--.

Col. 1, line 15, delete "bas" and insert --has--.

Col. 3, line 53, delete "Coo" and insert --$C_{oo}$--.

Col. 3, line 60, delete "Coo" and insert --$C_{oo}$--.

Signed and Sealed this

Fourteenth Day of February, 1995

Attest:

BRUCE LEHMAN

*Attesting Officer*   *Commissioner of Patents and Trademarks*